(12) United States Patent
Suzuki et al.

(10) Patent No.: US 8,593,820 B2
(45) Date of Patent: Nov. 26, 2013

(54) FLEXIBLE PRINTED WIRING BOARD AND ELECTRONIC APPARATUS

(75) Inventors: Daigo Suzuki, Yokohama (JP); Gen Fukaya, Hino (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 313 days.

(21) Appl. No.: 13/016,568

(22) Filed: Jan. 28, 2011

(65) Prior Publication Data
US 2012/0002376 A1 Jan. 5, 2012

(30) Foreign Application Priority Data
Jun. 30, 2010 (JP) ................................. 2010-150339

(51) Int. Cl.
H05K 1/00 (2006.01)
(52) U.S. Cl.
USPC ........................... 361/749; 361/803; 361/807
(58) Field of Classification Search
USPC .................. 361/749, 803, 807, 809, 681–683
See application file for complete search history.

(56) References Cited

U.S. PATENT DOCUMENTS

| | | | | |
|---|---|---|---|---|
| 4,870,308 A | * | 9/1989 | Sismour, Jr. .................... | 310/71 |
| 5,742,484 A | * | 4/1998 | Gillette et al. ................ | 361/789 |
| 6,172,881 B1 | * | 1/2001 | Hirai ............................. | 361/816 |
| 6,394,833 B1 | * | 5/2002 | Bulmer et al. ................ | 439/393 |
| 6,531,662 B1 | * | 3/2003 | Nakamura .................... | 174/255 |
| 6,612,851 B1 | * | 9/2003 | Goodwin et al. .............. | 439/66 |
| 6,648,675 B2 | * | 11/2003 | Welschholz et al. .......... | 439/492 |
| 6,797,891 B1 | * | 9/2004 | Blair et al. .................... | 174/268 |
| 6,825,472 B2 | * | 11/2004 | Endo .......................... | 250/370.09 |
| 6,985,659 B2 | * | 1/2006 | Torigoe et al. ................ | 385/114 |
| 2009/0126976 A1 | | 5/2009 | Iida | |

FOREIGN PATENT DOCUMENTS

| | | |
|---|---|---|
| JP | 04-048677 | 2/1992 |
| JP | 05-327135 | 12/1993 |
| JP | 2001-339125 | 12/2001 |
| JP | 2005-057515 | 3/2005 |
| JP | 2005-294639 | 10/2005 |
| JP | 2009-128521 | 6/2009 |
| JP | 2009-246081 | 10/2009 |
| JP | 2010-040720 | 2/2010 |

OTHER PUBLICATIONS

Japanese Patent Application No. 2010-150339; Notice of Reasons for Rejection; Mailed Apr. 26, 2011 (English translation).

* cited by examiner

*Primary Examiner* — Hung S Bui
(74) *Attorney, Agent, or Firm* — Blakely, Sokoloff, Taylor & Zafman LLP

(57) ABSTRACT

According to one embodiment, the flexible printed wiring board of the one embodiment has a base, corrugated portion, and block. The base has therein a conductor that electrically connects a first end and a second end. The corrugated portion is formed in a middle part of the base and has a ridge and legs. The ridge is roundly bent. The legs continuously hang from opposite sides of the ridge. The block is located off the ridge within a gap where the legs face each other and is mounted on one of the legs.

15 Claims, 9 Drawing Sheets

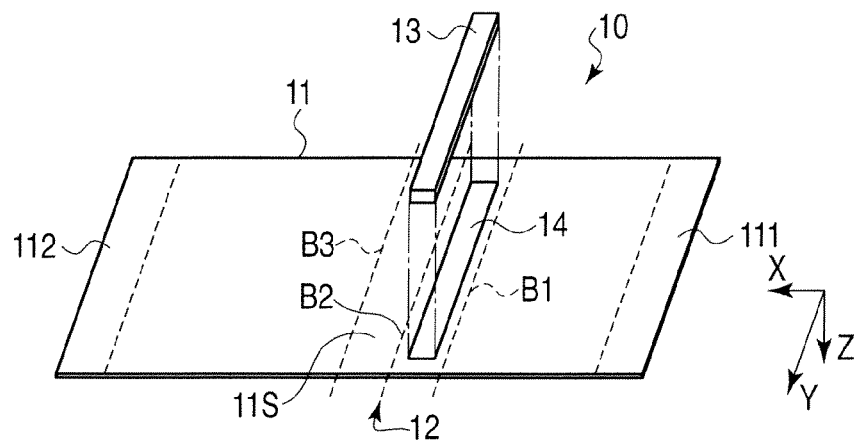
F I G. 3
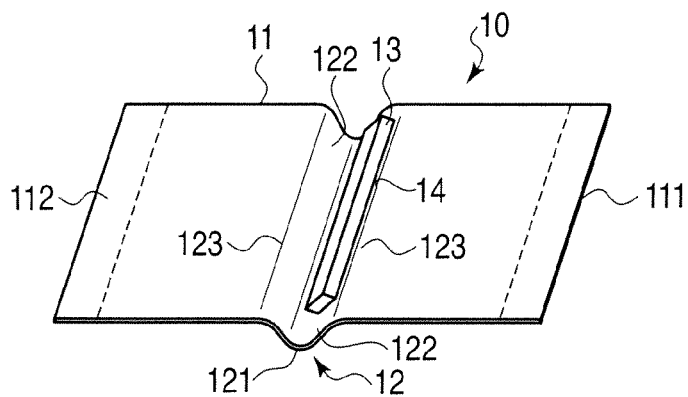
F I G. 4
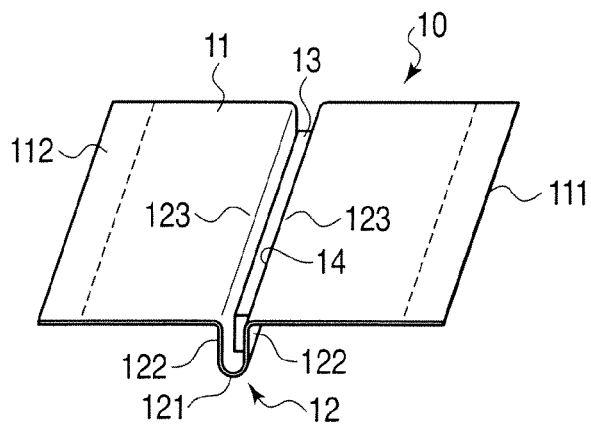
F I G. 5

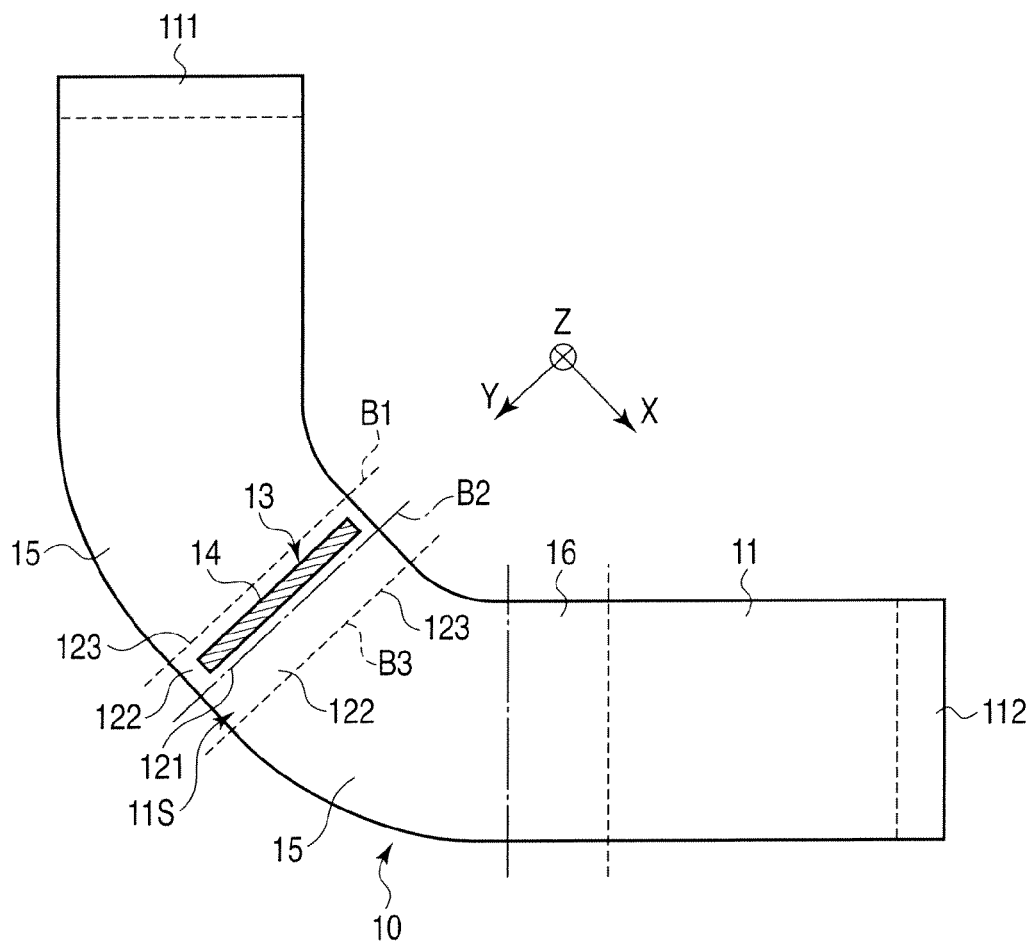
F I G. 10

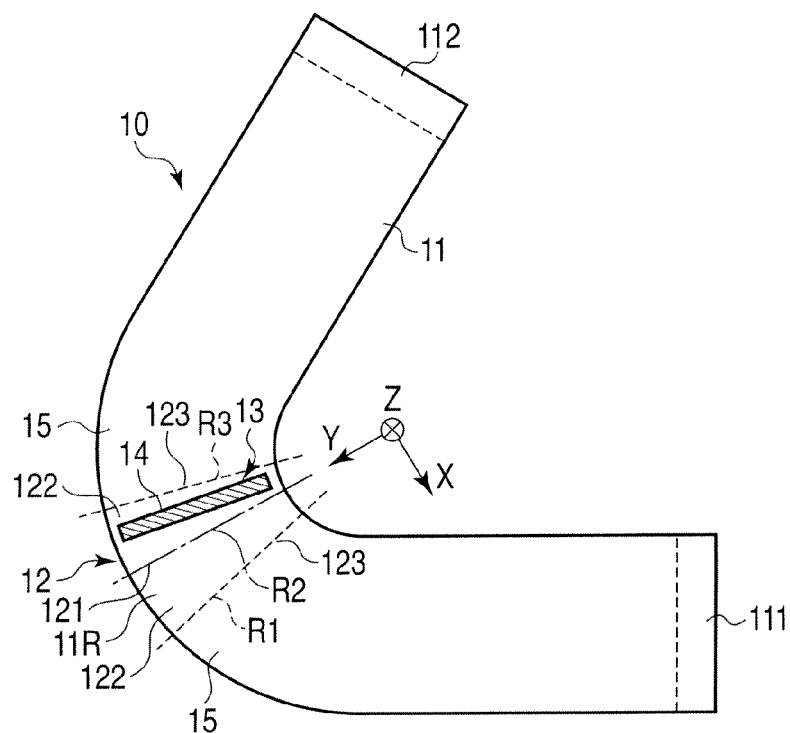
F I G. 13
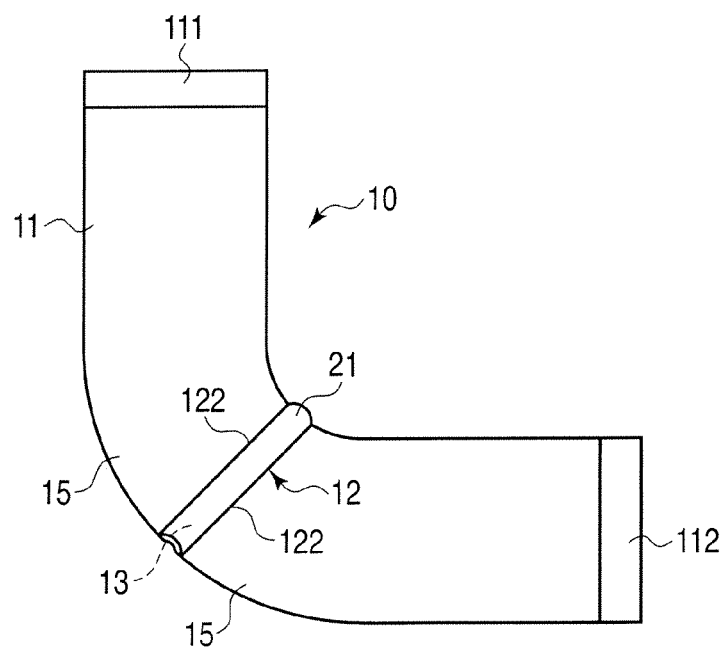
F I G. 14

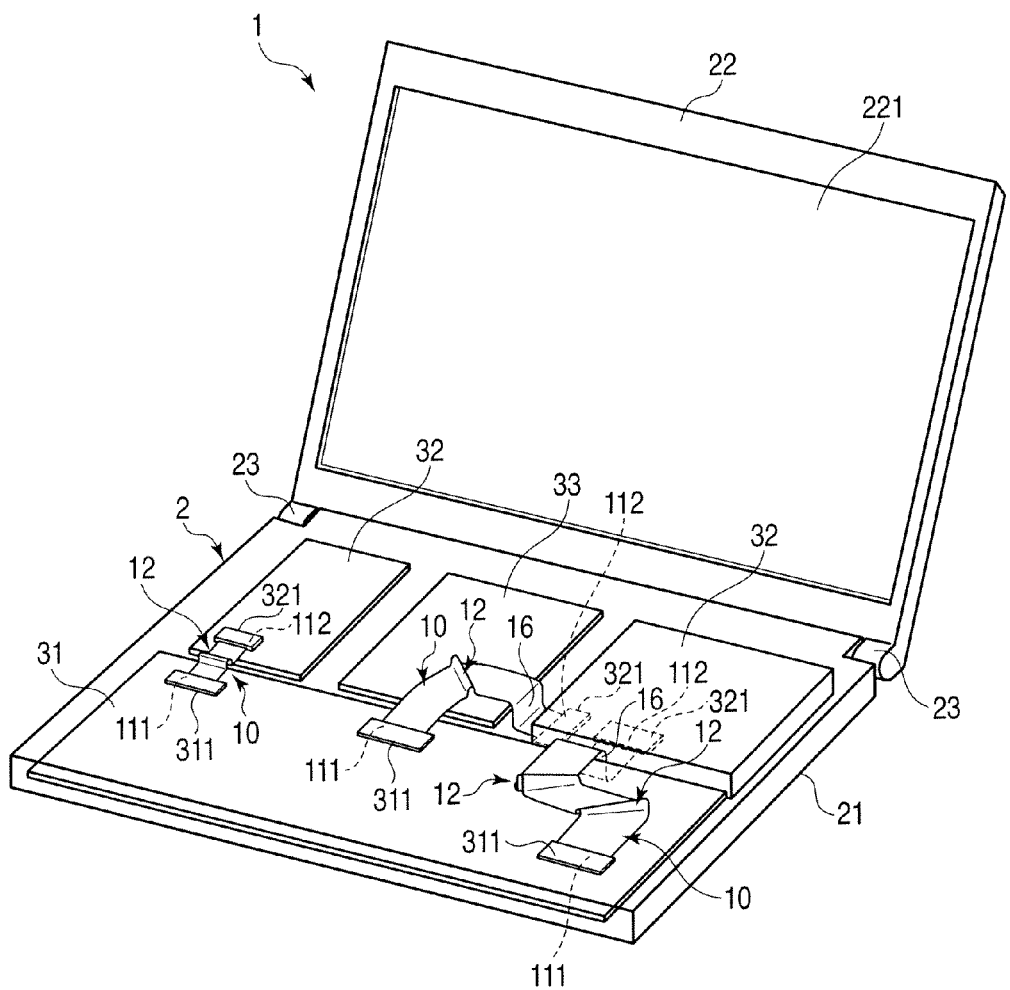
F I G. 16

US 8,593,820 B2

FLEXIBLE PRINTED WIRING BOARD AND ELECTRONIC APPARATUS

CROSS-REFERENCE TO RELATED APPLICATIONS

This application is based upon and claims the benefit of priority from Japanese Patent Application No. 2010-150339, filed Jun. 30, 2010; the entire contents of which are incorporated herein by reference.

FIELD

Embodiments described herein relate generally to a flexible printed wiring board comprising a structure allowing a bend or twist by causing of three-dimensional dislocations of both ends and an electronic apparatus comprising the flexible printed wiring board.

BACKGROUND

In some cases, a flexible printed wiring board (FPWB) may be used to mutually connect devices and substrates incorporated in a housing of an electronic apparatus. Since the FPWB bends freely, FPWB connects the devices and substrates even if connectors are mounted with deviation within assembly tolerance when the devices and substrates are fixed in the housing. Since this FPWB is a thin film, the FPWB is passed through narrow gaps between the devices and substrates.

If the devices and substrates are assembled in the housing with high density, the distances between devices and substrates which are connected by the FPWB are reduced. If the connectors for mounting the FPWB are only slightly dislocated, in this case, in-plane and out-of-plane stresses, such as tensile, compression, and shear stresses, as well as bending and torsional stresses, which may act on the FPWB, increase.

Even after the FPWB is mounted in place, the relative positions of the connectors for the FPWB may be displaced when the housing receives an external force. Since the FPWB is not flexible to an in-plane dislocation along its surface, loads easily act on junctions between the FPWB and the connectors. If these loads are repeatedly applied to the FPWB, disengagement or disconnection may occur.

Even in the case of high-density assembly, manual operations are performed to fasten the devices and substrates in the housing and connect them by the FPWB. The FPWB is pinched in thickness direction or width direction at right angles to the direction of insertion when the FPWB is connected. If the FPWB is short, therefore, special care must be taken not to break it, thus complicating the connection operation.

BRIEF DESCRIPTION OF THE DRAWINGS

A general architecture that implements the various feature of the embodiments will now be described with reference to the drawings. The drawings and the associated descriptions are provided to illustrate the embodiments and not to limit the scope of the invention.

FIG. 3 is an exploded perspective view of the FPWB of FIG. 1 in a developed state;

FIG. 4 is a perspective view of the FPWB of FIG. 3 being formed;

FIG. 5 is a perspective view of the FPWB of FIG. 4 in a completed form;

FIG. 10 is a plan view of the FPWB of FIG. 8 in a developed state;

FIG. 13 is a plan view of the FPWB of FIG. 11 in a developed state;

FIG. 14 is a plan view of the FPWB of FIG. 11;

FIG. 16 is a perspective view showing an electronic apparatus according to a fifth embodiment.

DETAILED DESCRIPTION

Various embodiments will be described hereinafter with reference to the accompanying drawings.

In general, according to one embodiment, there is provided a handy flexible printed wiring board, configured to absorb in-plane or out-of-plane displacements, if any, of end portions that connect a plurality of substrates and devices, and an electronic apparatus with the flexible printed wiring board.

The flexible printed wiring board of the one embodiment comprises a base, corrugated portion, and block. The base comprises a conductor that electrically connects a first end and a second end. The corrugated portion is formed in a middle part of the base and comprises a ridge and legs. The ridge is roundly bent. The legs continuously hang from opposite sides of the ridge. The block is located off the ridge within a gap between the legs and is fastened on one of the legs.

Figure 1:
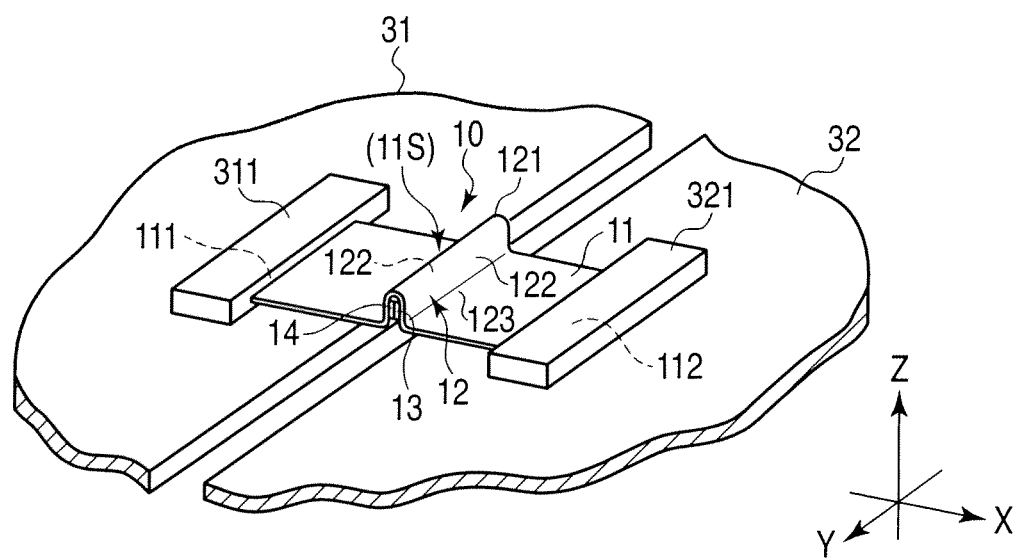
FIG. 1 is a perspective view showing an FPWB according to a first embodiment.

A flexible printed wiring board (FPWB) 10 according to a first embodiment will be described with reference to FIGS. 1 to 7. As shown in FIG. 1, the FPWB 10 comprises a base 11, corrugated portion 12, and block 13. The base 11 comprises a first end 111, second end 112 and a conductor 113 which is provided in inside and electrically connects the first end 111 and the second end 112. As shown in FIG. 1, the first end 111 and the second end 112 are located symmetrically with respect to the corrugated portion 12 in such manner that the first end 111, the second end 112 and corrugated portion 12 are lined up.

Figure 2:
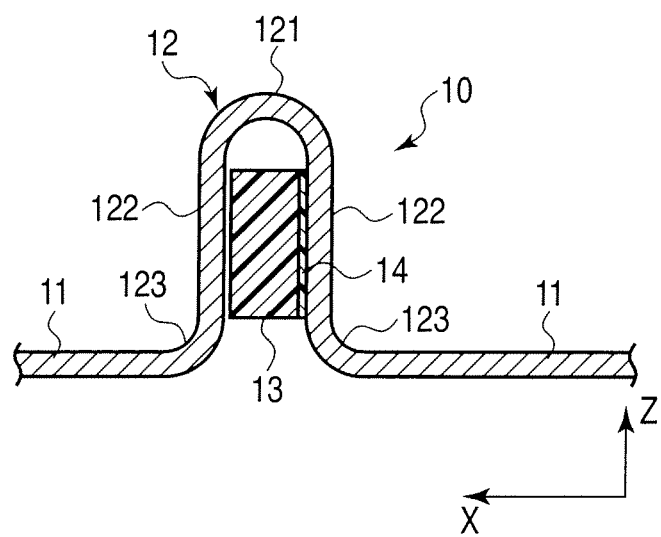
FIG. 2 is a sectional view of a corrugated portion of the FPWB shown in FIG. 1.

The corrugated portion 12 is at least one structure in a middle part of the base 11 and comprises a ridge 121 and legs 122, as shown in FIG. 2. The ridge 121 is roundly bent. The ridge 121 is bent with a radius at least larger than the minimum bend radius of the base 11. The legs 122 continuously hang from the opposite sides of the ridge 121. A bottom 123 of each leg 122 is also bent with a radius larger than the minimum bend radius of the base 11.

As shown in FIG. 2, the block 13 has a thickness larger than twice the minimum bend radius of the base 11 and a width less than that of each leg 122. Further, the block 13 is shorter than the base 11 in a direction across the base 11 between the first end 111, and the second end 112. The block 13 is located off the ridge 121 within a gap where the legs 122 face each other. The block 13 is adhesively bonded to one of the legs 122 and not to the other. FIG. 3 shows a state in which the base 11 of the FPWB 10 of FIG. 1 is flatly developed. As shown in FIG. 3, a view taken from the reverse side on which the block 13 is bonded. The block 13 is attached to the flatly extended base 11 with an adhesive agent 14. If the block 13 is formed of a liquid-crystal polymer, it will be bonded directly to the base 11 by thermocompression bonding.

The base 11 on which the block 13 is bonded is formed with the corrugated portion 12, as shown in FIGS. 4 and 5, by using a die-set or the like in such a manner that the part where the block 13 is bonded forms the leg 122 and that one side of the block 13 adjoins the ridge 121. The base 11 can maintain its original shape, since it contains an electrically conductive pattern of copper foil or the like as a conductor. The corrugated portion 12 is formed by folding back a straight portion 11S in the middle portion of the base 11 along segments B1, B2 and B3 that cross the straight portion. FIGS. 3 to 5 are views taken from the reverse side of the FPWB 10 for ease of illustration.

Figure 6:
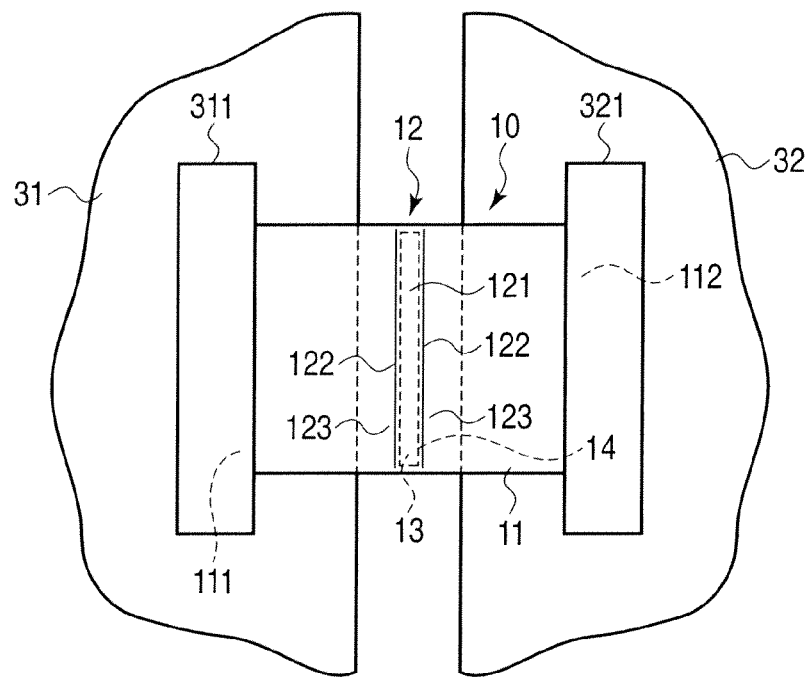
FIG. 6 is a plan view of the FPWB of FIG. 1.

As shown in FIG. 1, the FPWB 10 of the first embodiment constructed in the abovementioned connects a first module 31 and a second module 32 that individually operate in response to electrical signals. The FPWB 10 may be oriented in the manner shown in FIG. 5 when it connects the modules in the manner shown in FIG. 1. As shown in FIGS. 1 and 6, the first module 31 comprises connectors 311 and the second module 32 comprises connector 321, respectively, near their adjacent edges. The first end 111 of the FPWB 10 is introduced into the connector 311 of the first module 31 and the second end 112 of the FPWB 10 is introduced into the connector 321 of the second modules 32, respectively.

Figure 7:
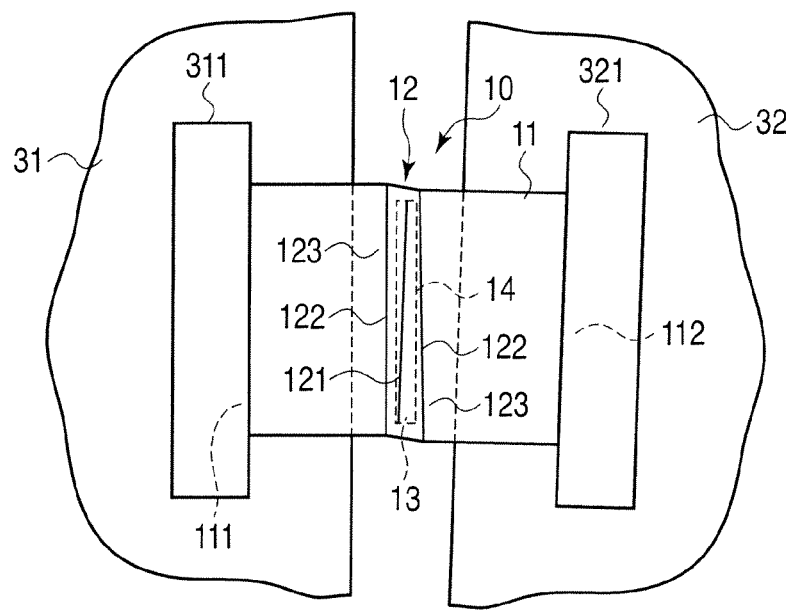
FIG. 7 is a plan view showing a case where the relative positions of substrates connected by the FPWB of FIG. 6 are deviated.

If the first module 31 and the second module 32 are located in target positions, individually, and if their connectors 311 and 321 are also mounted in their respective target positions, as shown in FIG. 6, the first end 111, the second end 112 and corrugated portion 12 of the FPWB 10 are lined up. The FPWB 10 comprises the corrugated portion 12. Hence, the corrugated portion 12 of the FPWB 10 absorbs the dislocations by being deformed, even if the first and second modules 31 and 32 or their connectors 311 and 321 are dislocated within assembly tolerance, as shown in FIG. 7.

Since the FPWB 10 comprises the corrugated portion 12, it can absorb an in-plane dislocation as well as an out-of-plane dislocation. Now let us assume that, in an XYZ coordinate system defined by three orthogonal axes, the X-direction is a direction in which the first end 111, the second end 112 and corrugated portion 12 are lined up, the Y-direction extends along the ridge 121, and the Z-direction is the thickness direction of the base 11. Thereupon, the "out-of-plane dislocation" means a dislocation along the thickness of the base 11 or in the Z-direction. The "in-plane dislocation" means a dislocation in any of directions including a compression direction, tensile direction, shear direction, and angular direction, along a surface of the base 11 or an XY-plane.

Since the block 13 is mounted between the legs 122, the ridge 121 is not bent beyond the minimum bend radius even if the connectors 311 and 321 approach each other in the in-plane direction of the base 11. The respective bottoms 123 of the legs 122 are die-bent larger than the minimum bend radius of the base 11. If the connectors 311 and 321 come too close to each other, the FPWB 10 is displaced so that the corrugated portion 12 is raised toward the ridge 121 side. Thus, the bottoms 123 is not bent beyond the minimum bend radius either.

The block 13 is adhesively bonded to only one of the legs 122. If the connectors 311 and 321 are displaced in the tensile or angular direction, legs 122 separate from each other. Hence, a tensile load is reduced. Likewise, if the connectors 311 and 321 are displaced in the shear direction, the block 13 and the other unbonded leg 122 slide on each other, therefore, a shear displacement is reduced by the corrugated portion 12.

An FPWB 10 according to a second embodiment will be described with reference to FIGS. 8 to 10. Constituent elements which have the same functions as those of the FPWB 10 in the first embodiment are denoted by the same respective reference numerals in the drawings, and a description of those constituent elements are omitted in the second embodiment.

Figure 8:
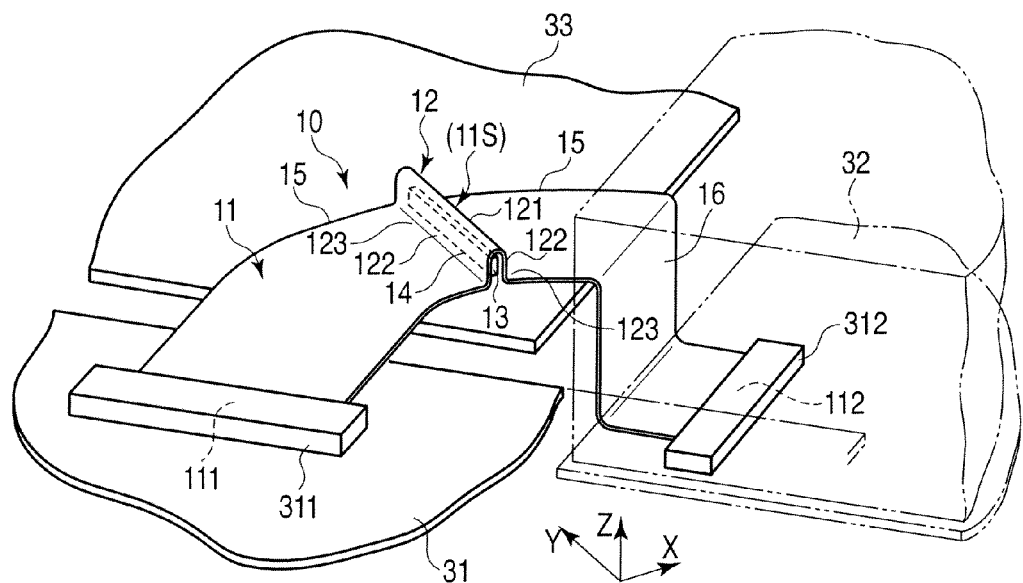
FIG. 8 is a perspective view showing an FPWB according to a second embodiment.

The FPWB 10 shown in FIG. 8 connects the connector 311 of the first module 31 and the connector 321 of the second module 32. The connector 311 is located on an edge of the first module 31 that adjoins a corner of a third module 33. The connector 321 of the second module 32 is located substantially at right angles to the connector 311 of the first module 31 beyond the corner of the third module 33. The connectors 311 and 321 are arranged on different levels each other in the thickness direction of a base 11.

As shown in FIG. 8, the base 11 comprises arcuate portions 15 and a step portion 16 as well as a corrugated portion 12 in its middle part. The first end 111 and the second end 112 are located at certain angles to the corrugated portion 12. The arcuate portions 15 extend oppositely from respective bottoms 123 of legs 122 of the corrugated portion 12. That part of the base 11 which is on the side of the second end 112 on which the step portion 16 is disposed is longer than that part on the side of the first end 111 by a margin corresponding to the step portion 16, as shown in FIG. 10.

Figure 9:
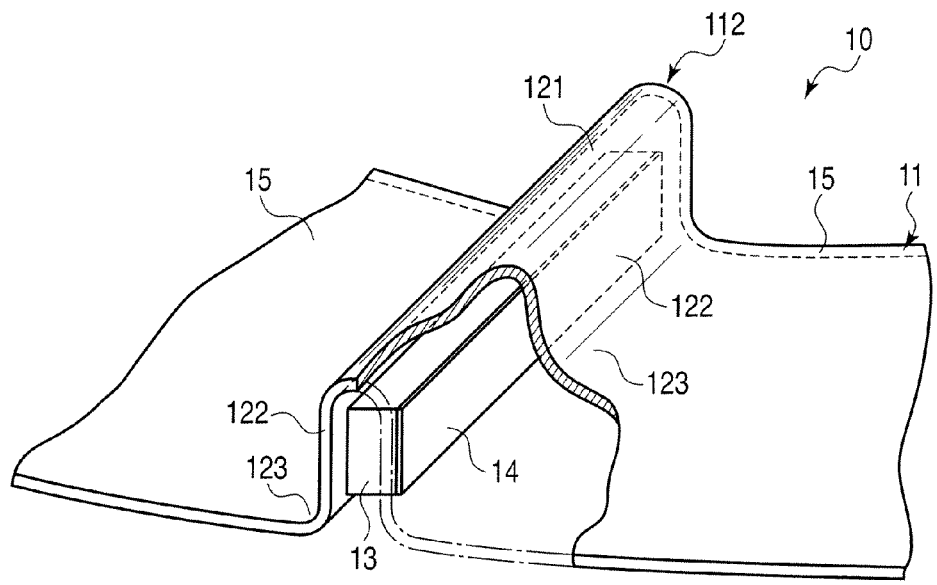
FIG. 9 is a cutaway perspective view enlargedly showing a corrugated portion of the FPWB of FIG. 8.

As shown in FIGS. 8 and 9, a ridge 121 of the corrugated portion 12 has a uniform height above the surface of the base 11 throughout its length from the inner peripheral side of the arcuate portions 15 to the outer peripheral side. That is, the corrugated portion 12, like that of the first embodiment, is formed by folding back a straight portion 11S in the middle part of the base 11 along segments B1, B2 and 33 that cross the straight portion. FIG. 10 is a rear view of the base 11 of the FPWB 10, shown in FIG. 8, in a flatly developed state, taken from the side on which a block 13 is bonded. As shown in FIG. 8, the step portion 16 is passed between the second module 32 and the third modules 33. Folded portions at the opposite ends of the step portion 16 are bent with a radius larger than the minimum bend radius of the base 11, as the ridge 121 and the bottoms 123 of the legs 122.

In the FPWB 10 of the second embodiment constructed in the abovementioned, as same as the FPWB 10 in the first embodiment, if the first and second modules 31 and 32 or their connectors 311 and 321 are dislocated within assembly tolerance, the corrugated portion 12 absorbs the out-of-plane and in-plane dislocations by being deformed. The FPWB 10 shown in FIGS. 8 to 10 comprises the step portion 16. However, the step portion 16 is unnecessary provided that the connector 311 of the first module 31 and the connector 321 of the second module 32 are flush with the base 11. If the step portion 16 is absent, the distance between the connectors 311 and 321 to be connected is shorter. This is an obvious advantage of the presence of the corrugated portion 12.

An FPWB 10 according to a third embodiment will be described with reference to FIGS. 11 to 14. Constituent elements which have the same functions as those of the FPWB 10 in the first or second embodiment are denoted by the same respective reference numerals in the drawings, and a description of those constituent elements are omitted in the third embodiment.

Figure 11:
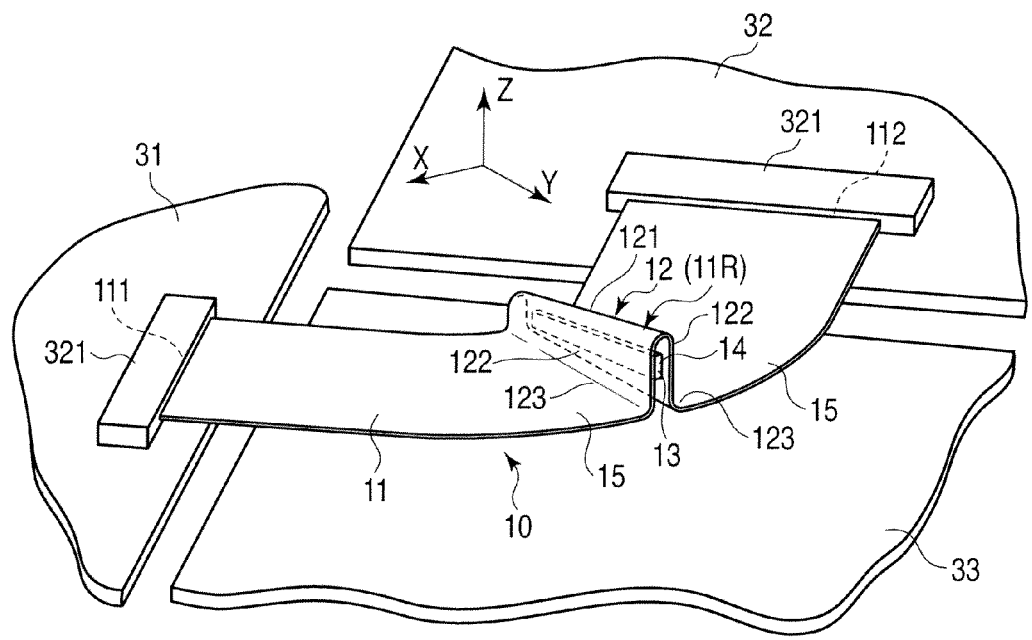
FIG. 11 is a perspective view showing an FPWB according to a third embodiment.

The FPWB 10 shown in FIG. 11 connects the connector 311 mounted on the first module 31 and the connector 321 mounted on the second module 32, respectively. The connector 321 of the second module 32 is located beyond a corner of a third module 33 and is flush with and substantially at right angles to the connector 311 of the first module 31. The first end 111 and the second end 112 are located at predetermined angles to a corrugated portion 12.

Figure 12:
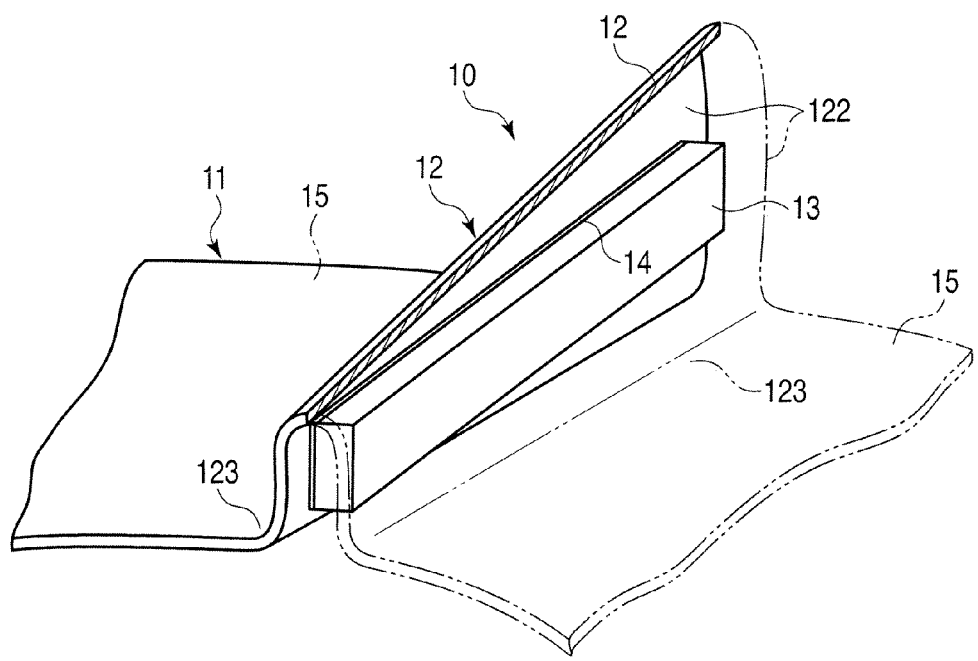
FIG. 12 is a cutaway perspective view enlargedly showing a corrugated portion of the FPWB of FIG. 11.

FIG. 11 is perspective view of arcuate portion 15 taken from the outer peripheral side, and FIG. 12 is perspective view of arcuate portion 15 taken from the inner peripheral side. As shown in FIGS. 11 and 12, a part of a ridge 121 of the corrugated portion 12 on the outer peripheral side of the arcuate portions 15 above a surface of a base 11 is higher than a part of the ridge 121 of the corrugated portion 12 on the inner peripheral side of the arcuate portion 15. In the case of this FPWB 10, the corrugated portion 12 is formed in the arcuate portion 15 by folding back a part of the base 11 having the same shape as the arcuate portions 15. That is, the corrugated portion 12 is formed by folding back a part of an arcuate portion 11R in the middle portion of the base 11 on segments R1, R2 and R3 along radii extending from the arc center of the arcuate portion shown in FIG. 13.

FIG. 13 is a rear view of the base 11 of the FPWB 10 shown in FIG. 11 in a flatly developed state, taken from the side on which a block 13 is bonded. When the corrugated portion 12 is formed on the base 11 shown in FIG. 13, the FPWB 10 is L-shaped, as shown in FIG. 14. The block 13 bonded on a leg 122 of the corrugated portion 12 is a square bar, as shown in FIG. 12. In this third embodiment, the block 13 may be a fan-shaped to fit the leg 122 of the corrugated portion 12 and having a thickness twice or more as large as the minimum bend radius of the base 11.

In the FPWB 10 of the third embodiment constructed in the abovementioned, the corrugated portion 12 absorbs the out-of-plane and in-plane dislocations by being deformed, even if the first module 31 and the second module 32 or their connectors 311 and 321 are dislocated within assembly tolerance. Since the corrugated portion 12 is formed of a part of the base 11 having the same arcuate shape as the arcuate portions 15, moreover, the flat base 11 shown in FIG. 13 is easily designed.

An FPWB 10 according to a fourth embodiment will be described with reference to FIG. 15. Constituent elements which have the same functions as those of the FPWB 10 in the first to third embodiments are denoted by the same respective reference numerals in the drawings, and a description of those constituent elements is omitted in the fourth embodiment.

Figure 15:
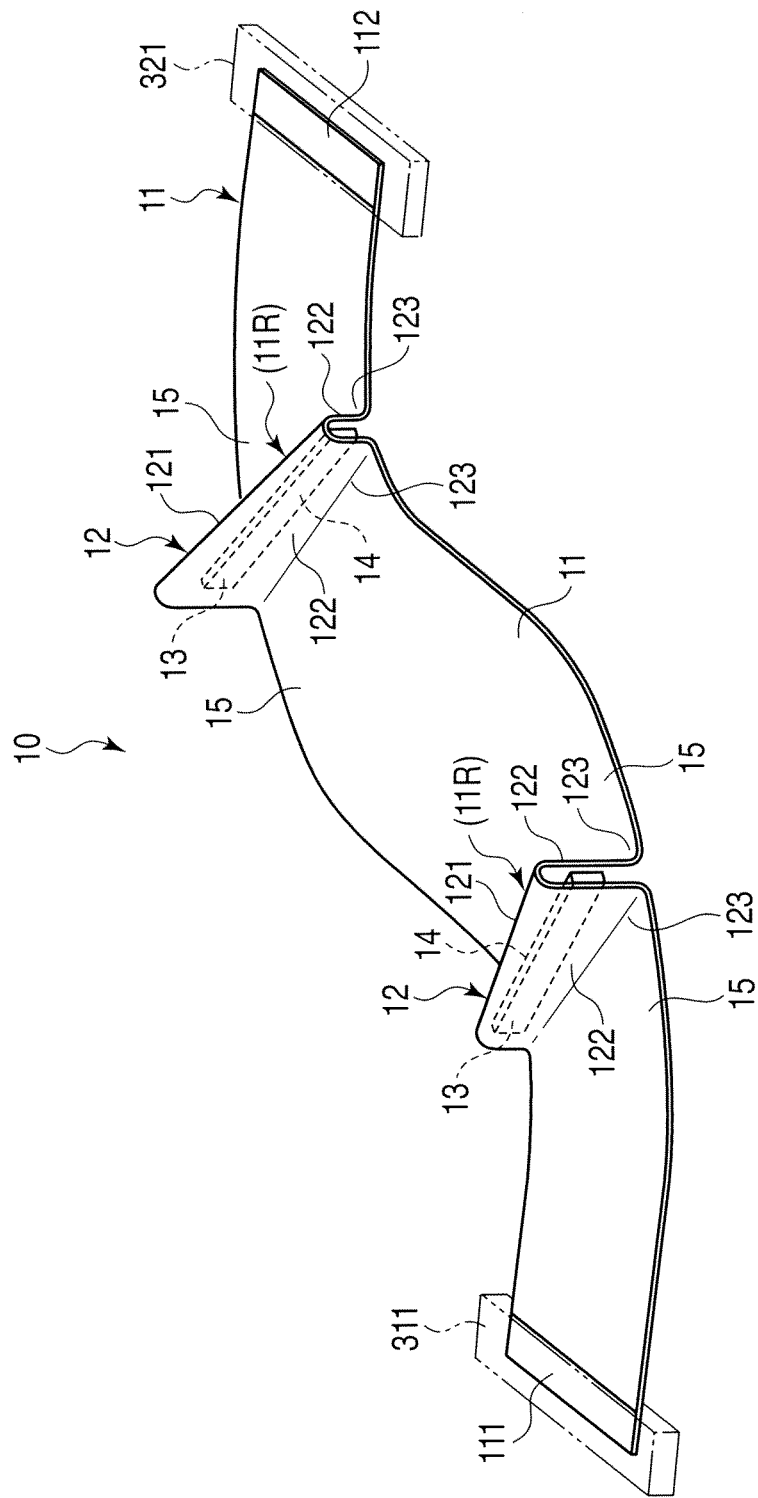
FIG. 15 is a perspective view showing an FPWB according to a fourth embodiment.

The FPWB 10 shown in FIG. 15 comprises two corrugated portions 12 having the same shape as that of the third embodiment, which are arranged between first end 111 and the second end 112. An external appearance of the FPWB 10 is in the shape of a crank. The corrugated portions 12 project on the same side from the base 11. In consideration of the arrangement of blocks 13 bonded to the corrugated portions 12, it is advisable to form the corrugated portions 12 on the same side. In view of the functionality of the FPWB 10, the corrugated portions 12 may be formed so as to project on either side of the base 11. The shape of the corrugated portions 12 may be the same as the shape of the corrugated portion 12 of the second embodiment instead of being the same as the shape of the corrugated portion 12 of the third embodiment.

The FPWB 10 constructed in the abovementioned connects connectors 311 and 321 provided on adjacent first and second modules 31 and 32, respectively. In this case, the connectors 311 and 321 are not located in opposite positions. If the connectors 311 and 321 are not arranged on the same plane, a step portion 16 is provided between the first end 111 or the second end 112 and corrugated portions 12, as in the FPWB 10 of the second embodiment.

The first end 111 and the second end 112 of the FPWB 10 of any of the first to fourth embodiments are introduced into the connectors 311 and 321, respectively. The connection operation is manually performed by an operator. If the connectors 311 and 321 are located close to each other, as in the FPWB 10 of the first embodiment shown in FIG. 1, the corrugated portion 12 is pinched in the thickness direction or the transverse direction relative to the base 11. The block 13 serves as a reinforcement member. In the FPWBs 10 of the second to fourth embodiments shown in FIGS. 8, 11 and 15, the corrugated portion or portions 12 are also pinched during the connection operation. Since the block 13 serves as a reinforcement member, the working efficiency is improved.

The distances from the first end 111 and the second end 112 to the corrugated portion 12 of the FPWB 10 of each of the second to fourth embodiments shown in FIGS. 8, 11 and 15 are shown to be longer than those of the FPWB 10 of the first embodiment shown in FIG. 1. Even if these distances are made as short as those of the FPWB 10 of the first embodiment, the FPWB 10 of any of the second to fourth embodiments comprises the corrugated portion 12. Stresses that act on the first end 111 and the second end 112 in the connectors 311 and 321 is reduced, even if the first module 31 and the second module 32 are dislocated.

An electronic apparatus 1 according to a fifth embodiment will now be described with reference to FIG. 16. This electronic apparatus 1 comprises a plurality of modules, a housing 2, and the FPWBs 10 according to the first, second, and fourth embodiments. In the present embodiment, the modules include first module 31, second module 32, and third module 33. The first module 31 comprises connectors 311 to which the respective first ends 111 of the FPWBs 10 of the first, second, and fourth embodiments are connected. The second module 32 comprises connectors 321 to which the respective second ends 112 of the FPWBs 10 of the first, second, and fourth embodiments are connected. As described in connection with the second embodiment, the FPWB 10 crosses above a corner of the third module 33. The third module 33 is electrically connected to its surrounding modules by the FPWB or by some other connection method.

The housing 2 comprises a main body 21 mounted with the first to third modules, display unit 22 comprising a display device 221, and hinges 23 that joint display unit 21 to the main body 21. The electronic apparatus 1 is a so-called notebook type computer. An input controller is disposed on the upper surface of the main body 21.

The FPWBs 10 of the first and second embodiments have been previously described. The crank-shape FPWB 10 of the fourth embodiment comprises a step portion 16 between the second end 112 and corrugated portion 12. Other structures of the FPWB 10 are the same as those described in connection with the embodiments described above. Thus, the same numerals are attached to the same constituted elements in FIG. 16, and a repeated description is omitted in the fifth embodiment.

In the electronic apparatus 1 constructed in abovementioned, plenty of modules other than the illustrated ones are mounted without substantial gaps in the main body 21. A high assembling accuracy is required when the distances between the modules are reduced. In the electronic apparatus 1 of the present embodiment, each of the FPWB 10 comprises the corrugated portion 12. The corrugated portion 12 absorbs dislocations of the second and third modules 32 and 33 assembled to the first module 31 even if the distances between the modules are reduced in the electronic apparatus 1. If the housing 2 is twisted or deformed after the assembly, the corrugated portion 12 will also reduce and absorb dislocations of the modules caused by the deformation.

In this specification, the "modules" are structures that are electrically connected to one another by the FPWBs 10, connectors, cables, and so on, whichever the modules operate independently or dependently. Thus, the modules include a storage medium, optical drive, etc., as well as circuit boards, mounted in the electronic apparatus 1.

The various modules of the systems described herein can be implemented as software applications, hardware and/or software modules, or components on one or more computers, such as servers. While the various modules are illustrated separately, they may share some or all of the same underlying logic or code.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An electronic apparatus comprising:
a housing; and
a flexible printed wiring board accommodated in the housing, the flexible printed wiring board comprises:
  a base comprising a conductor which electrically connects a first end and a second end,
  a corrugated portion placed on a middle part of the base, the corrugated portion comprising a ridge roundly bent and a pair of legs disposed on both sides of the ridge, and
  a block located apart from the ridge within a gap between the pair of legs, the block being physically attached to one of the legs, and detached from the other of the legs.

2. The electronic apparatus of claim 1, wherein:
the ridge is bent with a radius larger than a minimum bend radius of the base.

3. The electronic apparatus of claim 1, wherein:
the first end and the second end are located symmetrically with respect to the corrugated portion.

4. The electronic apparatus of claim 1, wherein:
the first end and the second end are located at predetermined angles to the corrugated portion.

5. The electronic apparatus of claim 1, wherein:
the base comprises a straight portion in the middle part; and
the corrugated portion is formed by folding back the straight portion on segments crossing the straight portion.

6. The electronic apparatus of claim 1, wherein:
the base comprises an arcuate portion in the middle part; and
the corrugated portion is formed by folding back the arcuate portion on segments along radii extending from the arc center of the arcuate portion.

7. The electronic apparatus of claim 1, wherein:
the block is shorter than the base in a direction across the base between the first end and the second end.

8. The electronic apparatus of claim 1, wherein:
the block is formed of a liquid-crystal polymer and is press-bonded to the one of the legs.

9. The electronic apparatus of claim 1, wherein the block of the flexible printed wiring board is physically attached to the one of the legs by bonding the one of the legs to a surface of the block while the other of the legs is not bonded to the block.

10. An electronic apparatus comprising:
a housing; and
a flexible printed wiring board accommodated in the housing, the flexible printed wiring board comprises:
  a base comprising a conductor, a first leg, a second leg and a ridge portion continuously connected between the first leg and the second leg, and
  a block configured with a first surface physically attached to the first leg distant from the ridge portion and a second surface detached from and separately facing the second leg, the second surface being an opposite side of the block from a portion of the first surface of the block that is fastened to the first leg.

11. The electronic apparatus of claim 10, wherein:
the ridge is bent with a radius larger than a minimum bend radius of the base.

12. The electronic apparatus of claim 10, wherein:
the block is formed of a liquid-crystal polymer and is press-bonded to one of the legs.

13. The electronic apparatus of claim 10, wherein the block of the flexible printed wiring board is physically attached to the one of the legs by bonding the one of the legs to a surface of the block while the other of the legs is not bonded to the block.

14. An electronic apparatus comprising:
a first module;
a second module separated from the first module; and
a flexible printed wiring board connecting between the first module and the second module, the flexible wiring board comprises:
  a base comprising a conductor which electrically connects a first end and a second end;
  a corrugated portion placed on a middle part of the base, and comprising a ridge roundly bent and a pair of legs disposed on both sides of the ridge, and
  a block located apart from the ridge within a gap between the legs, bonded to one of the legs, and not bonded to the other of the legs.

15. The electronic apparatus of claim 14, further comprising:
a housing accommodating the first module, the second module, and the flexible printed wiring board.

* * * * *